(12) United States Patent
Otsubo et al.

(10) Patent No.: US 11,348,894 B2
(45) Date of Patent: May 31, 2022

(54) HIGH-FREQUENCY MODULE

(71) Applicant: Murata Manufacturing Co., Ltd., Kyoto (JP)

(72) Inventors: Yoshihito Otsubo, Kyoto (JP); Motohiko Kusunoki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/095,940

(22) Filed: Nov. 12, 2020

(65) Prior Publication Data

US 2021/0066237 A1    Mar. 4, 2021

Related U.S. Application Data

(63) Continuation of application No. PCT/JP2019/021049, filed on May 28, 2019.

(30) Foreign Application Priority Data

Jun. 1, 2018   (JP) .............................. JP2018-105947

(51) Int. Cl.
*H01L 23/02* (2006.01)
*H01L 23/00* (2006.01)
(Continued)

(52) U.S. Cl.
CPC .............. *H01L 24/48* (2013.01); *H01L 23/02* (2013.01); *H01L 23/28* (2013.01); *H01L 23/552* (2013.01);
(Continued)

(58) Field of Classification Search
CPC .......... H01L 24/48; H01L 23/02; H01L 23/28
See application file for complete search history.

(56) References Cited

U.S. PATENT DOCUMENTS 8,012,868 B1    9/2011  Naval et al.
8,071,431 B2 *  12/2011 Hoang .................... H01L 24/97
                                                                257/E23.114
(Continued)

FOREIGN PATENT DOCUMENTS

EP          2752872 B1     6/2018
JP      2005-050868 A      2/2005
(Continued)

OTHER PUBLICATIONS

International Search Report for PCT/JP2019/021049 dated Aug. 6, 2019.
Written Opinion for PCT/JP2019/021049 dated Aug. 6, 2019.

*Primary Examiner* — Errol V Fernandes
(74) *Attorney, Agent, or Firm* — Pearne & Gordon LLP

(57) ABSTRACT

Provided is a high-frequency module capable of enhancing its shielding performance by reducing a placement interval of bonding wires at a desired position using a plurality of bonding wires different in arc height when a shield member is formed using the bonding wires. A high-frequency module includes a multilayer wiring board, components mounted on an upper surface of the multilayer wiring board, a shield member disposed along the component, a sealing resin layer, and a shield film. The shield member is formed of a plurality of bonding wires different in arc height. When the bonding wires are disposed by allowing a bonding wire having a high arc height to sequentially straddle a bonding wire having a low arc height in a nested manner, a placement interval of the bonding wires at a desired position can be reduced and shielding performance can be enhanced.

12 Claims, 6 Drawing Sheets

(51) Int. Cl.
  *H01L 23/28* (2006.01)
  *H01L 23/552* (2006.01)
(52) U.S. Cl.
  CPC .... *H01L 24/73* (2013.01); *H01L 2224/48091* (2013.01); *H01L 2224/48227* (2013.01); *H01L 2224/48247* (2013.01); *H01L 2924/181* (2013.01); *H01L 2924/3025* (2013.01)

(56) References Cited

U.S. PATENT DOCUMENTS

| | | |
|---|---|---|
| 10,134,682 B2 * | 11/2018 | Kumbhat ............ H01L 23/552 |
| 2007/0241440 A1 | 10/2007 | Hoang et al. |
| 2009/0236700 A1 | 9/2009 | Moriya |
| 2017/0118841 A1 | 4/2017 | Ino |
| 2017/0263568 A1 | 9/2017 | Jeon et al. |
| 2018/0092257 A1 | 3/2018 | Otsubo et al. |

FOREIGN PATENT DOCUMENTS

| | | |
|---|---|---|
| JP | 5276169 B2 | 8/2013 |
| JP | 2017-084898 A | 5/2017 |
| WO | 2008/093414 A1 | 8/2008 |
| WO | 2016/181954 A1 | 11/2016 |

* cited by examiner

HIGH-FREQUENCY MODULE

CROSS REFERENCE TO RELATED APPLICATION

This is a continuation of International Application No. PCT/JP2019/021049 filed on May 28, 2019 which claims priority from Japanese Patent Application No. 2018-105947 filed on Jun. 1, 2018. The contents of these applications are incorporated herein by reference in their entireties.

BACKGROUND OF THE DISCLOSURE

Field of the Disclosure

The present disclosure relates to a high-frequency module including a shield.

Description of the Related Art

Various high-frequency modules are mounted on a motherboard incorporated in an electronic device such as a communication terminal device. Some of this type of high-frequency module has a component mounted on a wiring board sealed with a sealing resin layer. The sealing resin layer may have a surface covered with a shield film to shield the component from noise. When a plurality of components is mounted on the wiring board, it may be desirable to shield only a specific component from noise. In this case, the shield film covering the surface of the sealing resin layer is less likely to shield only the specific component, so that design flexibility is low. Thus, a high-frequency module in which a shield member having high design flexibility can be disposed has been proposed. For example, as illustrated in FIG. 11, a high-frequency module 100 described in Patent Document 1 includes a component 102 mounted on a wiring board 101. Then, a plurality of wire bonds 103 is disposed around the component 102, and these wire bonds 103 shield the component 102. This allows the wire bonds 103 to be each mounted only at a place required to be shielded, so that the design flexibility is improved.

Patent Document 1: Japanese Patent No. 5276169 (refer to paragraphs [0021] to [0024], FIG. 3, etc.)

BRIEF SUMMARY OF THE DISCLOSURE

Although the high-frequency module 100 described above includes a shield member formed by disposing the wire bonds 103 at a predetermined interval, a placement interval between the wire bonds 103 is preferably reduced to allow the wire bonds 103 to be disposed closely for enhancement of shielding performance. For example, it is conceivable that the wire bonds 103 are closely disposed by reducing an interval between a first bond-side end of each of the wire bonds 103, being a starting point thereof, and a second bond-side end thereof, being an ending point thereof. Unfortunately, this case causes each of the wire bonds 103 to have a reduced interval between the first bond-side end and the second bond-side end while having an arc that does not change in height, so that each of the wire bonds 103 is likely to deform and may come into contact with the component 102. This requires a constant interval between each of the wire bonds 103 and the component 102 to be provided. As a result, a mounting area increases to cause a problem of increase in size of a module. Additionally, bending of the wire is less likely to be controlled on the second bond-side, so that a hemming bottom shape is required on the second bond-side. Thus, there is a limit to reducing the interval between the first bond-side end and the second bond-side end.

The present disclosure has been made in view of the above-mentioned problems, and an object thereof is to provide a high-frequency module having the improved mounting density by reducing an interval between a component and a bonding wire while improving shielding performance by reducing an interval between ends of the bonding wire.

To achieve the above object, a high-frequency module of the present disclosure includes: a wiring board; a first component mounted on a main surface of the wiring board; a shield member formed of a plurality of bonding wires each in an arc shape to shield at least the first component; a plurality of connection electrodes each formed on the main surface of the wiring board to be connected to any one of ends of the bonding wires; and a sealing resin layer for sealing the first component and the plurality of bonding wires. The plurality of connection electrodes, including a connection electrode connected to one end of the corresponding bonding wires and a connection electrode connected to another end of the corresponding bonding wires, is disposed in a line along an end edge of the first component as viewed from a direction perpendicular to the main surface of the wiring board. The plurality of bonding wires includes a bonding wire different in arc height, and a bonding wire having a higher arc height that straddles a bonding wire having a lower arc height.

This structure enables an interval between the first bond-side end and the second bond-side end of one bonding wire to be further reduced as an arc height thereof decreases, so that the bonding wire is less likely to deform. Thus, shielding performance can be enhanced by increasing density of wires at a desired position by preventing the bonding wires from coming into contact with a component. Additionally, an interval between each bonding wire and the component can be reduced, so that module mounting density can be increased to enable improvement in design flexibility.

The present disclosure enables placement intervals of respective bonding wires to be reduced by preventing the bonding wires from coming into contact with a component. Additionally, an interval between each of the bonding wires and the component can be reduced, so that module mounting density can be increased to enable improvement in design flexibility.

DETAILED DESCRIPTION OF THE DISCLOSURE

First Embodiment

Figure 1:
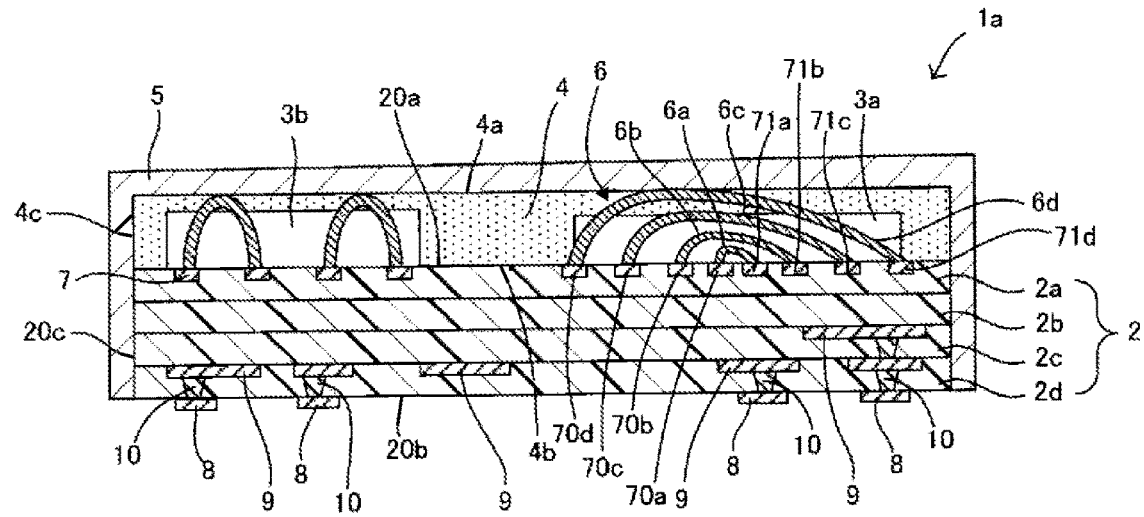
FIG. 1 is a sectional view of a high-frequency module according to a first embodiment of the present disclosure.
Figure 2:
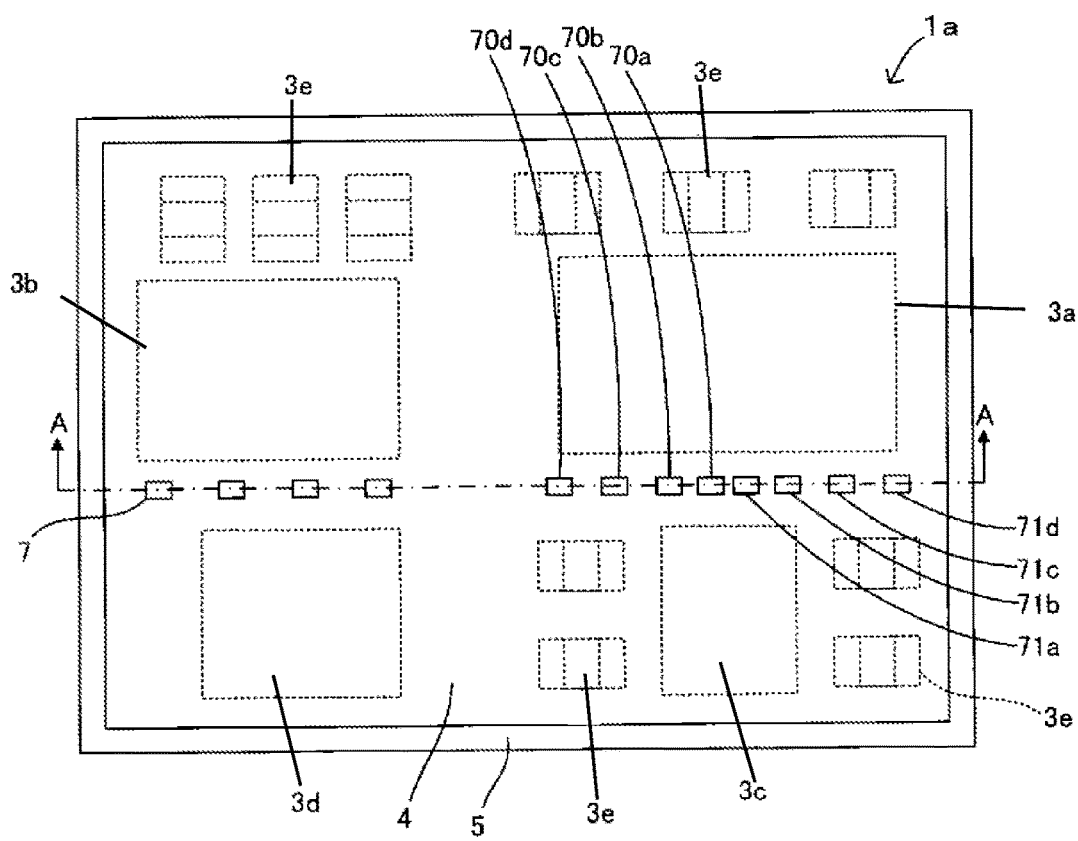
FIG. 2 is a plan view of the high-frequency module of FIG. 1 with a shield film removed.

With reference to FIGS. 1 and 2, a high-frequency module 1a according to a first embodiment of the present disclosure will be described. FIG. 1 is a sectional view taken along line A-A of FIG. 2, and FIG. 2 is a plan view of the high-frequency module 1a with a shield film 5 removed.

As illustrated in FIGS. 1 and 2, the high-frequency module 1a according to the present embodiment includes: a multilayer wiring board 2 (corresponding to the "wiring board" of the present disclosure); a plurality of components 3a to 3e mounted on an upper surface 20a of the multilayer wiring board 2; a sealing resin layer 4 laminated on the upper surface 20a of the multilayer wiring board 2; a shield film 5 covering a surface of the sealing resin layer 4; a shield member 6 including a plurality of bonding wires 6a to 6d mounted on the upper surface 20a of the multilayer wiring board 2, a connection electrode 7, and a plurality of connection electrodes 70a to 70d, and 71a to 71d, connected to the corresponding ends of the bonding wires 6a to 6d, and is mounted on a motherboard or the like of an electronic device using a high frequency signal, for example.

The multilayer wiring board 2 is formed by laminating a plurality of insulating layers 2a to 2d formed of low temperature co-fired ceramics, high temperature co-fired ceramics, or glass epoxy resin, for example. The upper surface 20a of the multilayer wiring board 2 (corresponding to "one main surface of the wiring board" of the present disclosure) is formed with the connection electrodes 70a to 70d and 71a to 71d, connected to the corresponding ends of the bonding wires 6a to 6d, and mounting electrodes (not illustrated) of the components 3a to 3e. Every two connection electrodes of four connection electrodes 7 illustrated in FIGS. 1 and 2 are separately connected using two respective bonding wires. The multilayer wiring board 2 has a lower surface 20b formed with a plurality of external electrodes 8 for external connection. Various types of internal wiring electrode 9 are formed between the respective insulating layers 2a to 2d adjacent to each other, and a plurality of via conductors 10 is formed inside the multilayer wiring board 2 to connect the internal wiring electrodes 9 formed in the respective insulating layers 2a to 2d to each other. The connection electrodes 7, 70a to 70d, and 71a to 71d, the mounting electrodes, the external electrodes 8, and the internal wiring electrodes 9, are each made of metal such as Cu, Ag, or Al, which is typically used for a wiring electrode. The via conductors 10 are each formed of metal such as Ag or Cu. The connection electrodes 7, 70a to 70d, 71a to 71d, the mounting electrodes, and the external electrodes 8 may be each plated with Ni/Au. In particular, the bonding wires are each typically an Au wire, and the connection electrodes 7, 70a to 70d, and 71a to 71d each have an outermost surface plated with Au so that the bonding wires are connected to the connection electrodes to form an Au—Au bonding.

The components 3a to 3e are each formed of a semiconductor element such as an IC and a PA (power amplifier), or a chip component such as a chip inductor, a chip capacitor, or a chip resistor, and are mounted on the multilayer wiring board 2 by a general surface mounting technique such as solder bonding.

The sealing resin layer 4 is made of a resin such as an epoxy resin that is generally used as a sealing resin, and seals the components 3a to 3d. The sealing resin layer 4 includes a lower surface 4b (corresponding to the "contact surface of the sealing resin layer" of the present disclosure) that is in contact with the multilayer wiring board 2, an upper surface 4a (corresponding to the "opposed surface of the sealing resin layer") facing the lower surface 4b, and a side surface 4c.

The shield member 6 is formed of the plurality of bonding wires 6a to 6d to serve as a compartment shield between the components 3a and 3c. The bonding wires 6a to 6d are each a wire made of metal such as Au, Al, and Cu, being generally used for wire bonding, and are different in arc height. Then, the bonding wire having a high arc height is disposed to straddle the bonding wire having a low arc height. Specifically, FIG. 1 illustrates placement in which the bonding wire 6a having the lowest arc height is straddled by the bonding wire 6b, the bonding wire 6b is straddled by the bonding wire 6c, and the bonding wire 6c is straddled by the bonding wire 6d. That is, the bonding wires 6a to 6d are each disposed in a nested manner, straddling one bonding wire. The ends of the bonding wires 6a to 6d are connected to the corresponding plurality of connection electrodes 70a to 70d, and 71a to 71d. The connection electrodes 70a to 70d, and 71a to 71d are disposed in a line along one side of the component 3a as illustrated in FIG. 2. The term, "disposed in a line", described here includes a case where the placement of the connection electrodes is deviated due to the manufacturing variations.

When the bonding wires 6a to 6d are disposed in this way, the shield member 6 serves as a compartment shield between the component 3a (corresponding to the "first component" of the present disclosure) and the component 3c (corresponding to the "second component" of the present disclosure). The bonding wire 6d having the highest arc height is partly exposed at the upper surface 4a of the sealing resin layer 4 and is in contact with the shield film 5. When the bonding wire 6d is partly in contact with the shield film 5, the shielding performance can be further improved. The connection electrodes 70a to 70d, and 71a to 71d are each connected to a ground electrode (not illustrated) formed on the multilayer wiring board 2. Although the connection electrodes 70a to 70d, and 71a to 71d are individually provided here, the connection electrodes 70a to 70d may be connected as a common electrode to the ground electrode, for example. Similarly, the connection electrodes 71a to 71d may be connected as a common electrode to the ground electrode. When the connection electrodes are formed into a common electrode, the bonding wires 6a to 6d may come into contact with each other. However, when they come into contact with each other, they may be deformed or come into contact with the component, and thus they preferably do not come into contact with each other.

As illustrated in FIG. 2, the shield member 6 is disposed between the component 3a and the component 3c. In particular, to enhance the shielding performance between the components 3a and 3c, the bonding wires are preferably disposed at small intervals at the respective positions in between the components 3a and 3c, i.e., in a region in between portions of the respective components 3a and 3c, facing each other. For example, when the bonding wires 6a and 6b each having a low arc height are disposed between the components 3a and 3c, the bonding wires 6a and 6b each can have a small interval between the first bond-side end (corresponding to the "starting point of bonding" of the present disclosure) and the second bond-side end (corresponding to the "ending point of bonding" of the present disclosure). When an interval between the first bond-side end and the second bond-side end of the bonding wire having a high arc height is reduced, the wire is likely to be deformed and may come into contact with a component. In the present application, the bonding wire having a low arc height is formed at a place where an interval between the first bond-side end and the second bond-side end is small, so that an interval between wires can be narrowed while the wires are prevented from coming into contact with a component by being reduced in deformation.

As illustrated in FIG. 2, the placement intervals of the connection electrodes 70a, 70b, 71a, and 71b disposed in the region in between the portions of the respective components 3a and 3c, facing each other, are narrower than the placement intervals of the other connection electrodes 70c, 70d, 71c, and 71d. Disposing in this way enables the shielding performance between the components 3a and 3c to be enhanced as described above. An interval between the connection electrode 70a connected to the first bond-side end of the bonding wire 6a and the connection electrode 71a connected to the second bond-side end of the bonding wire 6a can be reduced by reducing the arc height of the bonding wire 6a. Additionally, the connection electrode 70a connected to the first bond-side end of the bonding wire 6a and the connection electrode 70b connected to the first bond-side end of the bonding wire 6b are each connected to the first bond-side end, so that the placement interval therebetween can be reduced. When the bonding wire 6b is formed to straddle the bonding wire 6a, an interval between the connection electrode 71a connected to the second bond-side end of the bonding wire 6a and the connection electrode 71b connected to the second bond-side end of the bonding wire 6b also can be reduced.

In contrast, the bonding wires 6c and 6d each have a high arc height, and the connection electrodes 70c and 70d connected to the first bond-side ends of the bonding wires 6c and 6d, respectively, and the connection electrodes 71c and 71d connected to the second bond-side ends of the bonding wires 6c and 6d, respectively, are disposed at large intervals. In general, the bonding wire has a property of being less likely to be deformed as the arc height of the bonding wire decreases and the interval between the connection electrodes (both ends of the wire) increases. This is because even when the wire is used for the connection electrodes at the same interval, the increase in arc height (loop height) of the wire increases the wire in length and the amount of twist of the wire. In particular, when an interval between the connection electrodes is small, the increase in loop height of the wire increases deformation at the apex of the loop. This causes the wire to be twisted largely and easily deformed. The present embodiment is configured such that the bonding wires 6a and 6b each having a low arc height are disposed in a portion where it is desirable to reduce an interval between the connection electrodes and the bonding wires 6c and 6d each having a high arc height are disposed in a portion where it is acceptable to increase the interval between the connection electrodes. This enables achieving both improvement in shielding performance and prevention of deformation of the bonding wires.

The shield film 5 is configured to cover the surfaces (upper surface 4a, side surface 4c) of the sealing resin layer 4 and a side surface 20c of the multilayer wiring board 2.

The shield film 5 is also connected to the ground electrode (not illustrated) exposed at the side surface 20c of the multilayer wiring board 2.

The shield film 5 can be formed in a multi-layer structure including an adhesion film laminated on the upper surface 4a of the sealing resin layer 4, a conductive film laminated on the adhesion film, and a protective film laminated on the conductive film. Here, the adhesion film is provided to enhance the adhesion strength between the conductive film and the sealing resin layer 4, and can be made of metal such as SUS. The conductive film is a layer having a substantial shielding function of the shield film 5, and can be made of metal of any one of Cu, Ag, and Al, for example. The protective film is provided to prevent the conductive film from being corroded or scratched, and can be made of SUS, for example.

Thus, the above-described embodiment enables the placement interval of the connection electrodes 70a, 70b, 71a, and 71b to be reduced by disposing the bonding wires 6a, 6b having a low arc height in a portion where it is desirable to enhance the shielding performance. Additionally, the bonding wires 6a and 6b each have a low arc height and are less likely to come into contact with the components 3a and 3c, so that an interval between each of the components 3a and 3c, and the shield member 6 can be reduced. This enables mounting density of the high-frequency module 1a to be increased. When the connection electrodes 70a to 70d, and 71a to 71d are disposed in a line and the bonding wires each having a high arc height are disposed to straddle the bonding wires each having a low arc height, a compartment shield can be formed at a desired position of a component to be shielded, and thus the shielding performance for the component can be improved.

Second Embodiment

Figure 3:
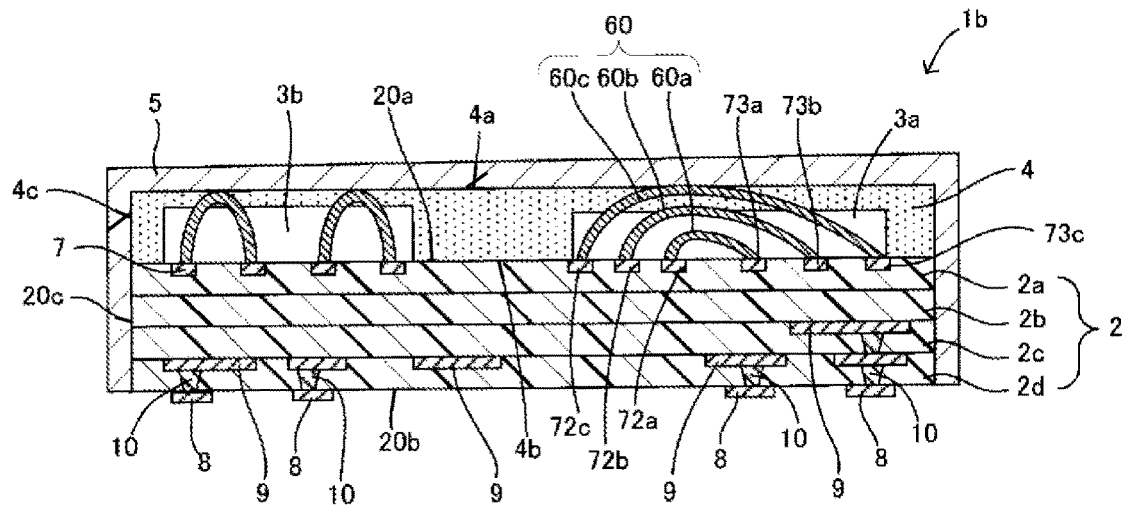
FIG. 3 is a sectional view of a high-frequency module according to a second embodiment of the present disclosure.
Figure 4:
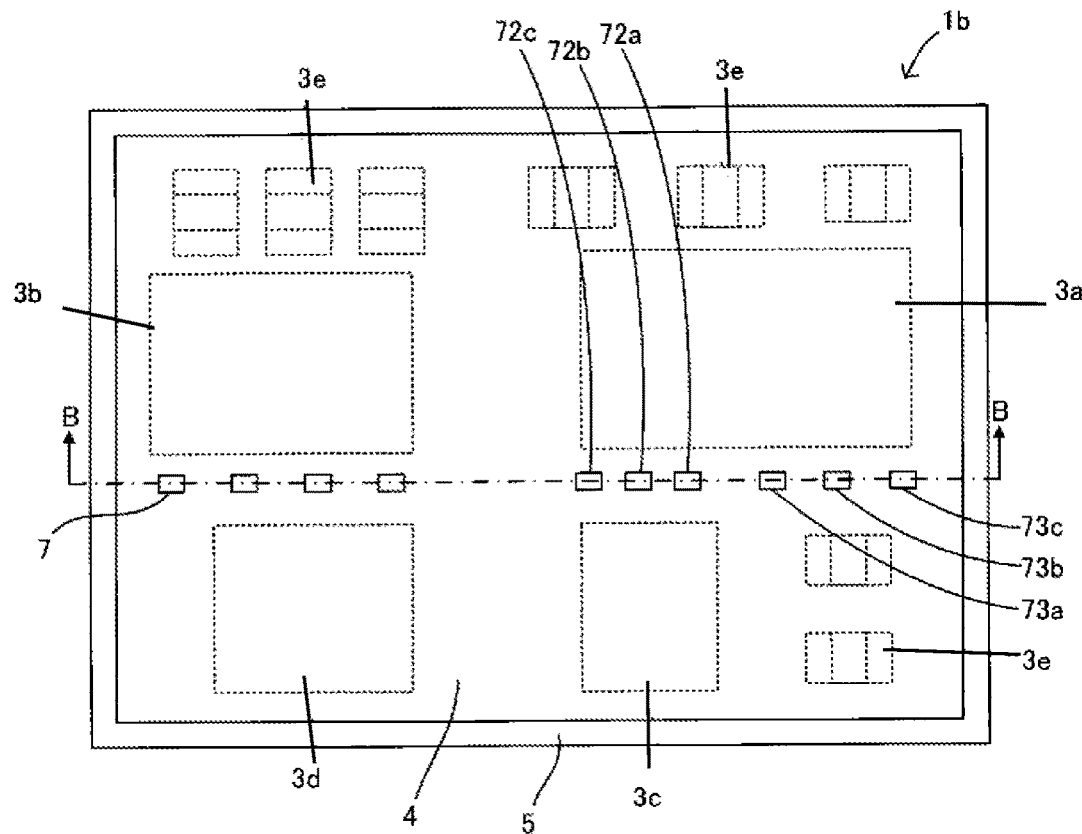
FIG. 4 is a plan view of the high-frequency module of FIG. 3 with a shield film removed.

With reference to FIGS. 3 and 4, a high-frequency module 1b according to a second embodiment of the present disclosure will be described. FIG. 3 is a sectional view of the high-frequency module 1b, taken along line B-B of FIG. 4. FIG. 4 is a plan view of the high-frequency module 1b with a shield film 5 removed.

The high-frequency module 1b according to the present embodiment and the high-frequency module 1a according to the first embodiment described with reference to FIGS. 1 and 2 are different from each other in that, as illustrated in FIGS. 3 to 4, each connection electrode 7 is disposed allowing the placement intervals of connection electrodes 72a to 72c connected to first bond-side ends of bonding wires 60a to 60c, respectively, to be smaller than the placement intervals of connection electrodes 73a to 73c connected to second bond-side ends of bonding wires 60a to 60c, respectively. Other structures are the same as those of the high-frequency module 1a according to the first embodiment, and thus the same reference numerals are given to eliminate the duplicated description thereof.

In the present embodiment, a shield member 60 between a component 3a and a component 3c is formed of the bonding wires 60a to 60c. The connection electrodes 72a to 72c connected to first bond-side ends of the bonding wires 60a to 60c, respectively, are disposed between the components 3a and 3c. The bonding wires 60a to 60c each have a portion on the first bond-side, being easily increased in height, and a portion on the second bond-side, being difficult to be adjusted for height, in a direction perpendicular to an upper surface 20a of a multilayer wiring board 2. Thus, when the first bond-side ends of the respective bonding wires 60a to 60c are disposed between the components 3a and 3c, being desired to have enhanced shielding performance, at small intervals, density of the bonding wires between the components 3a and 3c can be increased to enhance the shielding performance.

Thus, besides an effect similar to that of the high-frequency module 1a of the first embodiment, the above-described embodiment enables the shielding performance to be enhanced at a desired position by reducing the placement intervals of the connection electrodes 72a to 72c connected to the first bond-side ends of the bonding wires 60a to 60c, respectively, to less than the placement intervals of the connection electrodes 73a to 73c connected to the second bond-side ends of the bonding wires 60a to 60c, respectively.

(Modification of Bonding Wire)

Figure 5:
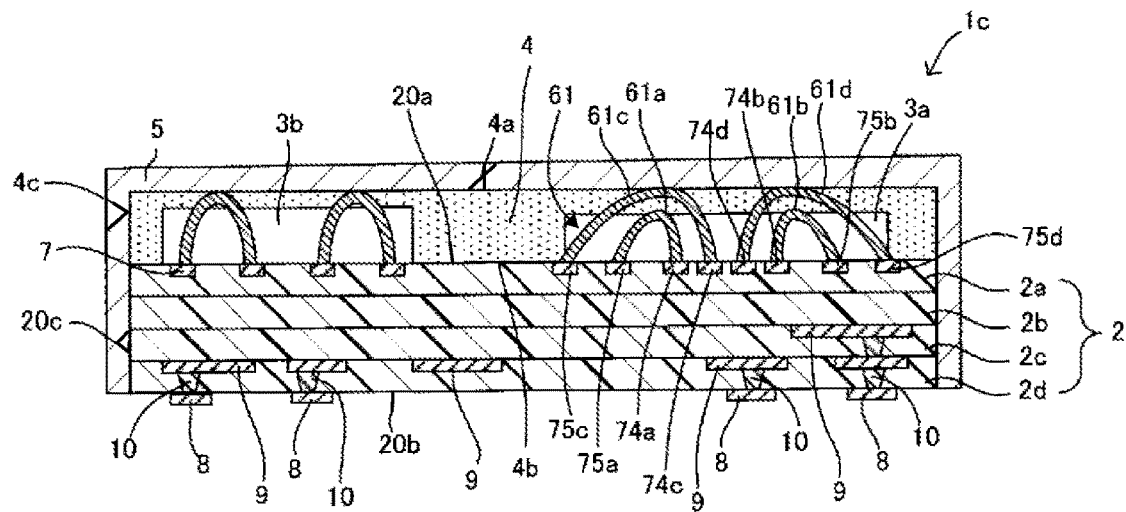
FIG. 5 is a diagram illustrating a modification of bonding wire placement of the high-frequency module of FIG. 3.
Figure 6:
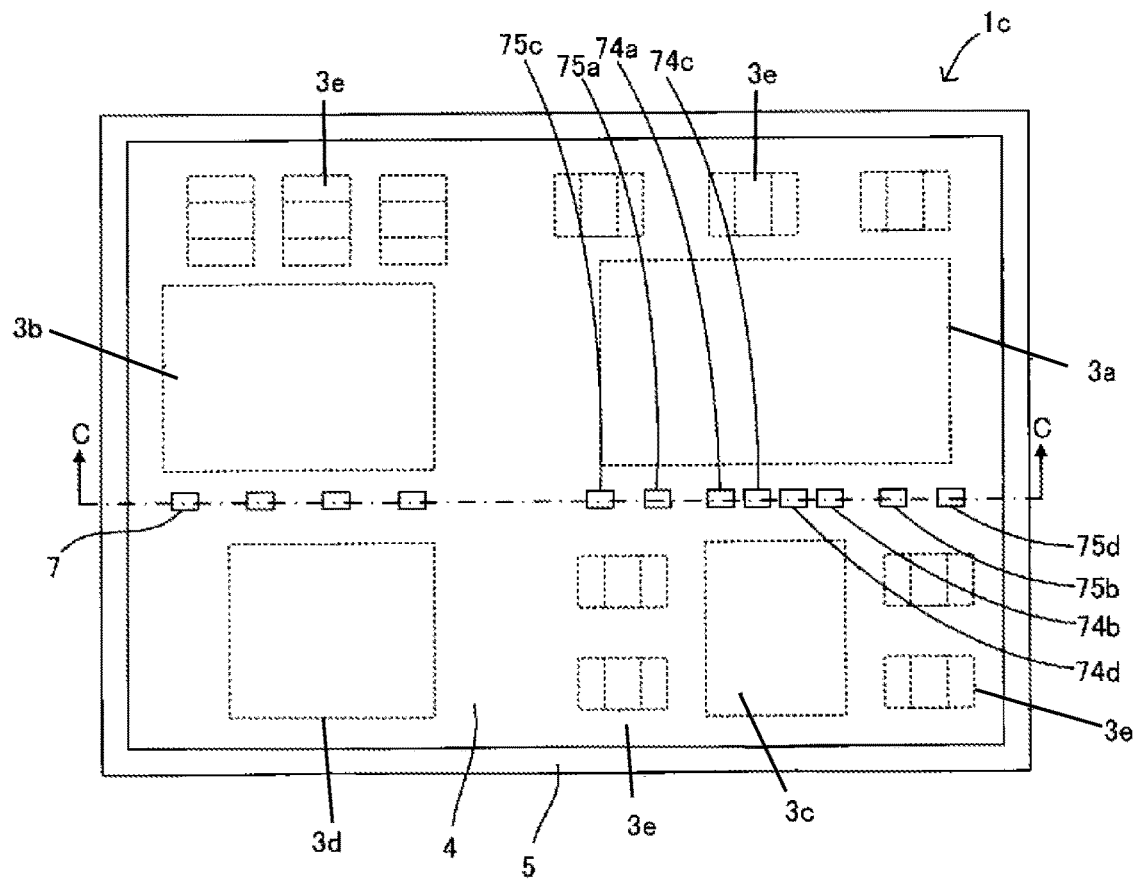
FIG. 6 is a plan view of the high-frequency module of FIG. 5 with a shield film removed.

The above-described embodiment includes the shield member 60 disposed linearly that is provided on one side with the connection electrodes 72a to 72c connected to the first bond-side ends of the bonding wires 60a to 60c, respectively, and on the other side with the connection electrodes 73a to 73c connected to the second bond-side ends of the bonding wires 60a to 60c, respectively. In contrast, as in a high-frequency module 1c illustrated in FIGS. 5 and 6, connection electrodes 74a to 74d connected to first bond-side ends of wires 61a to 61d, respectively, may be disposed in a central portion of a shield member 61, and connection electrodes 75a to 75d connected to second bond-side ends of the bonding wires 61a to 61d, respectively, may be disposed in corresponding opposite end portions of the shield member 61. At this time, the connection electrodes 74a to 74d for the first bond-side are disposed at the respective positions in between the components 3a and 3c, i.e., in a region in between portions of the respective components 3a and 3c, facing each other. In this way, the shielding performance at a desired position can be enhanced by changing placement of the bonding wires 61a to 61d and the connection electrodes 74a to 74d, and 75a to 75d.

Third Embodiment

Figure 7:
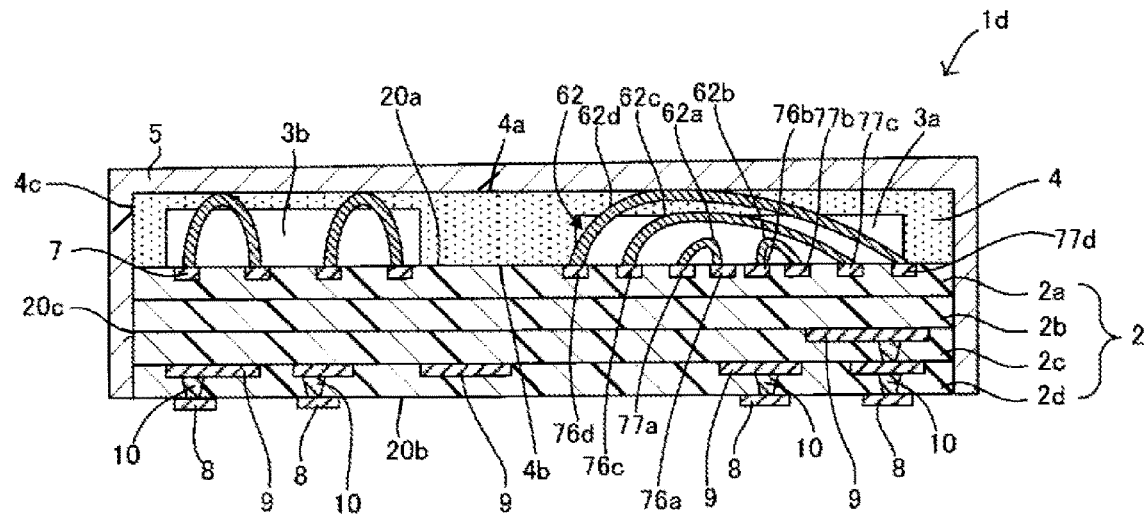
FIG. 7 is a sectional view of a high-frequency module according to a third embodiment of the present disclosure.
Figure 8:
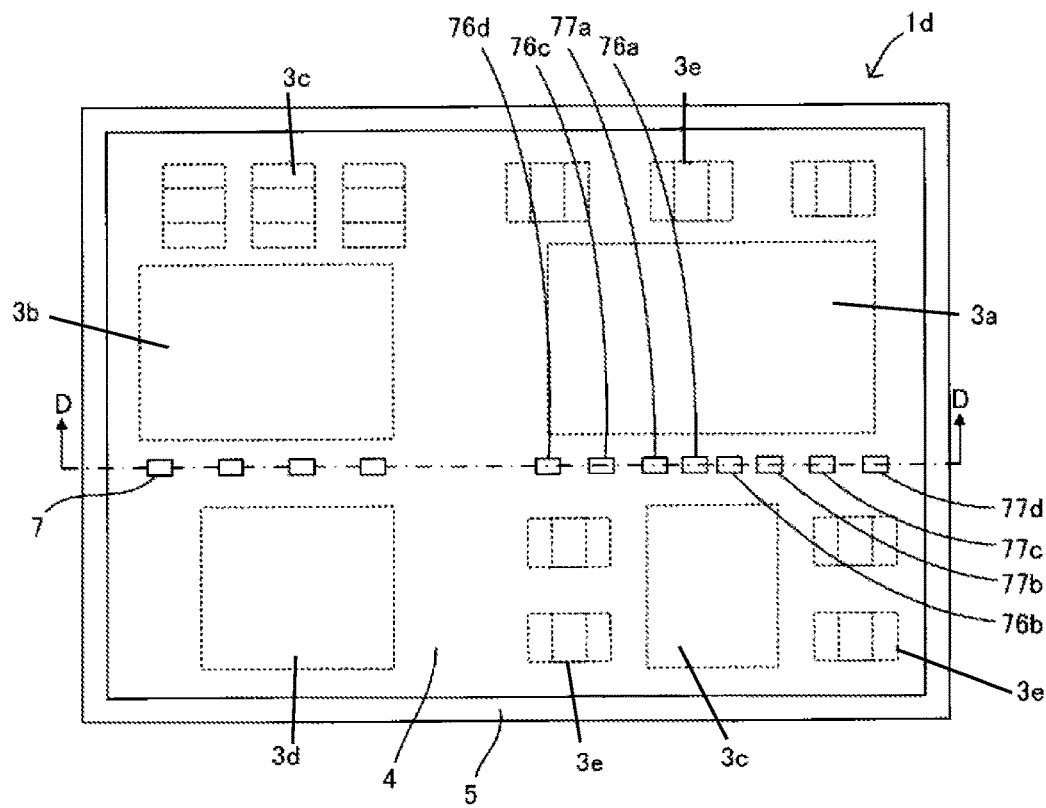
FIG. 8 is a plan view of the high-frequency module of FIG. 7 with a shield film removed.

With reference to FIGS. 7 to 8, a high-frequency module 1d according to a third embodiment of the present disclosure will be described. FIG. 7 is a sectional view of the high-frequency module 1d, taken along line D-D of FIG. 8. FIG. 8 is a plan view of a state in which a shield film 5 of FIG. 7 is removed.

The high-frequency module 1d according to the embodiment and the high-frequency module 1a of the first embodiment described with reference to FIGS. 1 and 2 are different from each other in that, as illustrated in FIGS. 7 and 8, each of bonding wires 62a to 62d does not straddle one bonding wire in a nested manner, but the bonding wire 62c straddles the two bonding wires 62a and 62b, and the bonding wire 62d straddles the bonding wire 62c. Other structures are the same as those of the high-frequency module 1a according to the first embodiment, and thus the same reference numerals are given to eliminate duplicated description thereof.

The present embodiment includes a shield member 62 formed of three types of bonding wires 62a to 62d different in arc height. These bonding wires 62a to 62d include the two bonding wires 62a and 62b having the lowest arc height that are disposed with one ends connected to the corresponding connection electrodes 76a and 77a and the other ends connected to the corresponding connection electrodes 76b and 77b, and the bonding wire 62c that is disposed to straddle the bonding wires 62a and 62b, having one end connected to the connection electrode 76c and the other end connected to the connection electrode 77c. The bonding wire 62d having the highest arc height has one end connected to the connection electrode 76d and the other end connected to the connection electrode 77d. The connection electrodes 76a and 76b respectively connected to the bonding wires 62a and 62b having the lowest arc height on their first bond-sides and the connection electrodes 77a and 77b respectively connected to the second bond-side ends of the bonding wires 62a and 62b can be disposed at small intervals. Thus, the connection electrodes are disposed in portions between the component 3a and the component 3c, the portions being particularly desired to be enhanced for shielding performance.

Thus, besides an effect similar to that of the high-frequency module 1a of the first embodiment, the above-described embodiment enables the shielding performance to be enhanced at a desired position by changing placement of the bonding wires 62a to 62d and the connection electrodes 76a to 76d, and 77a to 77d.

(Modification of Bonding Wire)

Figure 9:
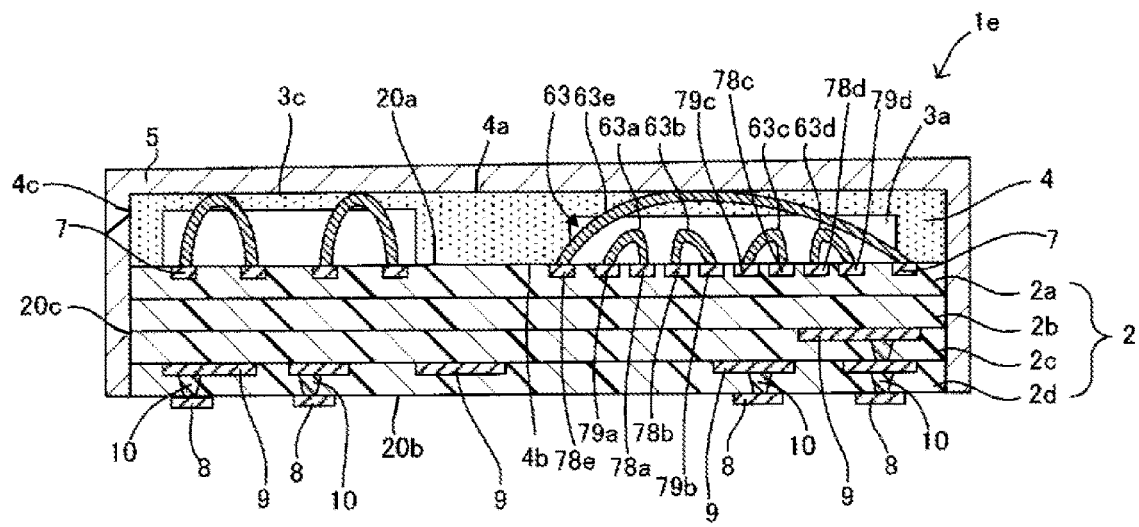
FIG. 9 is a diagram illustrating a modification of bonding wire placement of the high-frequency module of FIG. 7.
Figure 10:
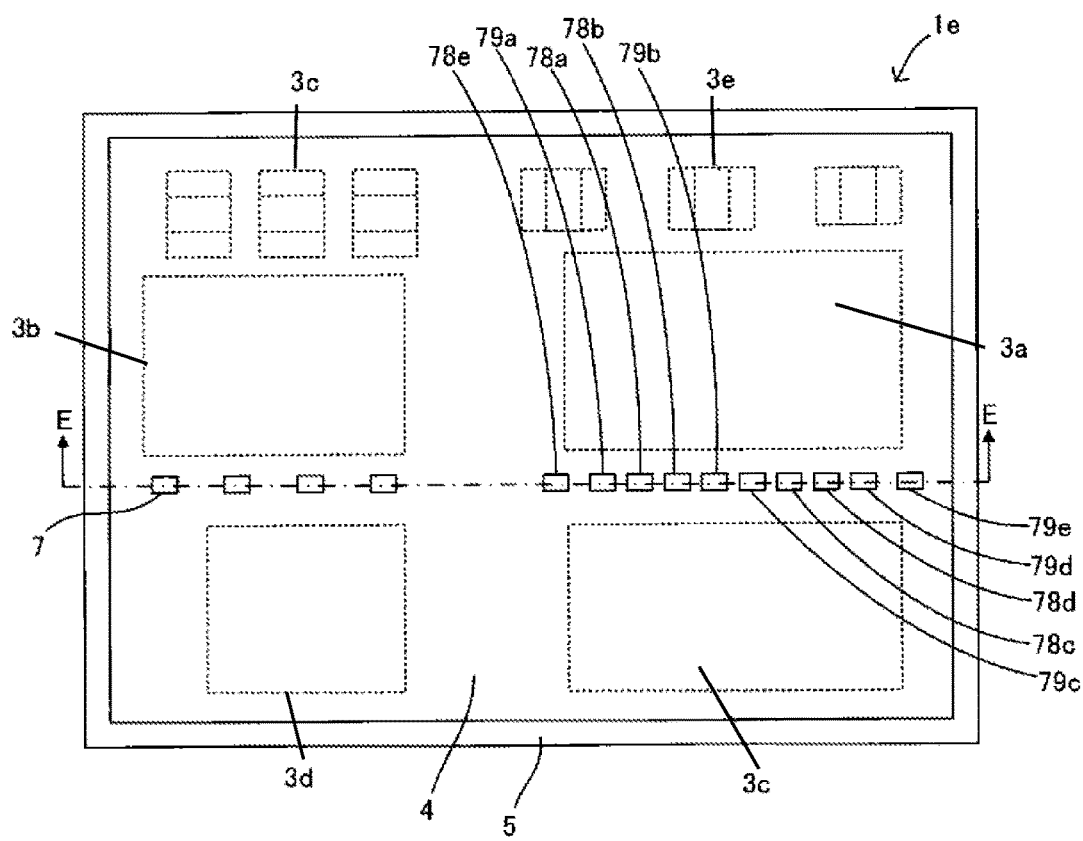
FIG. 10 is a plan view of the high-frequency module of FIG. 9 with a shield film removed.
Figure 11:
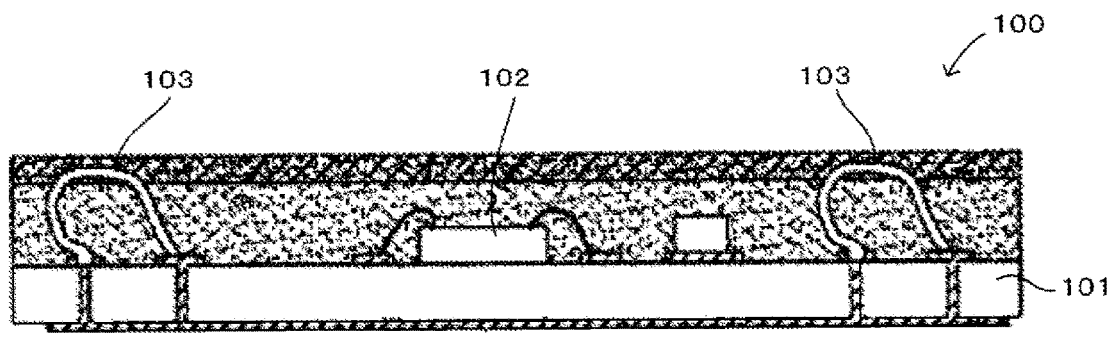
FIG. 11 is a sectional view of a conventional high-frequency module.

Although the two bonding wires 62a, 62b having the lowest arc height are disposed in the above-described embodiment, a shield member 63 may be formed such that four bonding wires 63a to 63d having the lowest arc height are disposed, and one bonding wire 63e is disposed to straddle them, as in a high-frequency module 1e illustrated in FIGS. 9 and 10. Increasing the number of bonding wires 63a to 63d having the lowest arc height enables reducing the placement intervals of the connection electrodes 78a to 78d, and 79a to 79d connected to the corresponding ends of the bonding wires 63a to 63d, so that the shield member 63 can be formed without deteriorating the shielding performance even for a wide portion desired to be enhanced for the shielding performance.

The present disclosure is not limited to the above-described embodiments, and various modifications other than those described above can be made without departing from the spirit of the disclosure. For example, the structures of the above-described embodiments and modifications may be combined.

For example, although each connection electrode is connected to the ground electrode in the above-described embodiments, at least one end of each bonding wire may be connected to a common ground electrode. In this case, the shielding performance can be further improved.

Although the shield film 5 is formed on the surface of the sealing resin layer 4 in the above-described embodiments, the shield film 5 may not be formed.

The present disclosure can be applied to various high-frequency modules each including a shield.

1a to 1e: high-frequency module
2: multilayer wiring board (wiring board)
3a: component (first component)
3c: component (second component)
4: sealing resin layer
5: shield film
6, 60 to 63: shield member
6a to 6c: bonding wire
70a to 70d, 71a to 71d: connection electrode

The invention claimed is:
1. A high-frequency module comprising:
a wiring board;
a first component mounted on a main surface of the wiring board;

a shield member comprised of a plurality of bonding wires each in an arc shape for shielding at least the first component;

a plurality of connection electrodes each provided on the main surface of the wiring board to be connected to any one of ends of the bonding wires; and a sealing resin layer for sealing the first component and the plurality of bonding wires, the plurality of connection electrodes, including a connection electrode connected to one end of the corresponding bonding wires and a connection electrode connected to another end of the corresponding bonding wires, being disposed in a line along an end edge of the first component as viewed from a direction perpendicular to the main surface of the wiring board, and the plurality of bonding wires including bonding wires different in arc height, and a bonding wire having a higher arc height straddling one or more bonding wires having a lower arc height, wherein the high-frequency module further comprises a second component mounted on the main surface of the wiring board, wherein the shield member includes a first portion positioned in between the first component and the second component, and a second portion not positioned in between the first component and the second component, and the plurality of connection electrodes includes first connection electrodes disposed in the first portion and second connection electrodes disposed in the second portion, and the first connection electrodes have a narrower interval between adjacent connection electrodes than the second connection electrodes.

2. The high-frequency module according to claim 1, wherein each of the first connection electrodes is connected to an end serving as a starting point of bonding of both ends of the corresponding one of the bonding wires, and each of the second connection electrodes is connected to an end serving as an ending point of bonding of both ends of the corresponding one of the bonding wires.

3. The high-frequency module according to claim 1, wherein the sealing resin layer has a contact surface in contact with the main surface of the wiring board, an opposed surface facing the contact surface, and a side surface connecting an end edge of the contact surface and an end edge of the opposed surface to each other, and the sealing resin layer is further provided with a shield film covering at least the opposed surface and the side surface of the sealing resin layer.

4. The high-frequency module according to claim 3, wherein the bonding wire having a higher arc height is partly exposed at the opposed surface of the sealing resin layer and is in contact with the shield film.

5. The high-frequency module according to claim 1, wherein at least one end of each of the plurality of bonding wires is connected to a common ground electrode provided on the wiring board using the connection electrode.

6. The high-frequency module according to claim 2, wherein the sealing resin layer has a contact surface in contact with the main surface of the wiring board, an opposed surface facing the contact surface, and a side surface connecting an end edge of the contact surface and an end edge of the opposed surface to each other, and the sealing resin layer is further provided with a shield film covering at least the opposed surface and the side surface of the sealing resin layer.

7. The high-frequency module according to claim 2, wherein at least one end of each of the plurality of bonding wires is connected to a common ground electrode provided on the wiring board using the connection electrode.

8. The high-frequency module according to claim 3, wherein at least one end of each of the plurality of bonding wires is connected to a common ground electrode provided on the wiring board using the connection electrode.

9. The high-frequency module according to claim 4, wherein at least one end of each of the plurality of bonding wires is connected to a common ground electrode provided on the wiring board using the connection electrode.

10. A high-frequency module comprising:

a wiring board;

a first component mounted on a main surface of the wiring board;

a shield member comprised of a plurality of bonding wires each in an arc shape for shielding at least the first component;

a plurality of connection electrodes each provided on the main surface of the wiring board to be connected to any one of ends of the bonding wires; and a sealing resin layer for sealing the first component and the plurality of bonding wires, the plurality of connection electrodes, including a connection electrode connected to one end of the corresponding bonding wires and a connection electrode connected to another end of the corresponding bonding wires, being disposed in a line along an end edge of the first component as viewed from a direction perpendicular to the main surface of the wiring board, and the plurality of bonding wires including bonding wires different in arc height, and a bonding wire having a higher arc height straddling one or more bonding wires having a lower arc height, wherein the one or more bonding wires having a lower arc height include a plurality of bonding wires each having a lower arc height, and connection electrodes connected to respective ends of the plurality of bonding wires each having a lower arc height are disposed between a connection electrode connected to one end of the bonding wire having a higher arc height and a connection electrode connected to another end of the bonding wire having a higher arc height to allow the plurality of bonding wire having a higher arc height to straddle the bonding wires having a lower arc height.

11. The high-frequency module according to claim 10, wherein the sealing resin layer has a contact surface in contact with the main surface of the wiring board, an opposed surface facing the contact surface, and a side surface connecting an end edge of the contact surface and an end edge of the opposed surface to each other, and the sealing resin layer is further provided with a shield film covering at least the opposed surface and the side surface of the sealing resin layer.

12. The high-frequency module according to claim 10, wherein at least one end of each of the plurality of bonding wires is connected to a common ground electrode provided on the wiring board using the connection electrode.

* * * * *